United States Patent
Yoon (10) Patent No.: US 9,369,173 B1
(45) Date of Patent: Jun. 14, 2016

(54) DIRECTIONAL ANTENNA ISOLATION STRUCTURE

(71) Applicant: BROADCOM CORPORATION, Irvine, CA (US)

(72) Inventor: Seunghwan Yoon, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/634,211

(22) Filed: Feb. 27, 2015

Related U.S. Application Data (60) Provisional application No. 62/114,765, filed on Feb. 11, 2015.

(51) Int. Cl.
*H04B 1/44* (2006.01)
*H04B 7/04* (2006.01)
*H04B 1/04* (2006.01)

(52) U.S. Cl.
CPC .. *H04B 1/44* (2013.01); *H04B 7/04* (2013.01); *H04B 2001/0408* (2013.01)

(58) Field of Classification Search
CPC .................................... H04B 1/44; H04B 7/04
USPC ........................................................... 455/78
See application file for complete search history.

(56) References Cited

U.S. PATENT DOCUMENTS

| | | | | |
|---|---|---|---|---|
| 5,973,601 A * | 10/1999 | Campana, Jr. | ..... | G08B 21/0222 340/573.4 |
| 6,337,628 B2 * | 1/2002 | Campana, Jr. | ......... | G08B 21/02 340/573.4 |
| 7,079,815 B2 * | 7/2006 | Pozgay | .................... | H04B 1/48 455/191.3 |
| 7,417,515 B2 * | 8/2008 | Chominski | .............. | H04B 1/48 333/101 |
| 7,590,390 B2 * | 9/2009 | Weber | ...................... | H04B 7/04 455/287 |
| 2001/0054983 A1 * | 12/2001 | Judd | ...................... | H01Q 1/246 343/810 |
| 2004/0235426 A1 * | 11/2004 | Pozgay | .................... | H04B 1/48 455/73 |
| 2005/0052245 A1 * | 3/2005 | Rofougaran | .............. | H03F 3/19 330/301 |
| 2006/0061511 A1 * | 3/2006 | Enoki | ...................... | H01Q 1/02 343/702 |
| 2007/0072561 A1 * | 3/2007 | Weber | ...................... | H04B 7/04 455/101 |
| 2010/0321129 A1 * | 12/2010 | Onody | ..................... | H01P 1/213 333/124 |
| 2013/0200947 A1 * | 8/2013 | Alexopoulos | ...... | H01Q 15/0006 327/560 |

* cited by examiner

*Primary Examiner* — April G Gonzales
(74) *Attorney, Agent, or Firm* — Garlick & Markison; Bruce E. Garlick (57) ABSTRACT

An RF structure includes a PA, a PA ground switch coupled between the PA output and ground, a LNA, and a LNA ground switch coupled between the LNA input and ground. The RF structure includes a plurality of directional antenna structures, each including an antenna, a transmit quarter wavelength circuit coupled between the PA output and the antenna, a receive quarter wavelength circuit coupled between the antenna and the LNA input, and an antenna switch coupled between the antenna and ground. Switch control circuitry controls the PA ground switch, the LNA ground switch, and the plurality of antenna switches during transmit and receive operations to control the flow of RF receive signals from the antennas to the LNA and the flow of RF transmit signals from the PA to the antennas. The transmit and receive quarter wavelength circuits may be traces or be constructed of lumped circuit elements.

20 Claims, 9 Drawing Sheets

DIRECTIONAL ANTENNA ISOLATION STRUCTURE

CROSS REFERENCE TO RELATED PATENTS/PATENT APPLICATIONS

Provisional Priority Claim

The present U.S. Utility Patent Application claims priority pursuant to 35 U.S.C. §119(e) to U.S. Provisional Application No. 62/114,765, entitled "Directional Antenna Isolation Structure," filed Feb. 11, 2015, which is hereby incorporated herein by reference in its entirety and made part of the present U.S. Utility Patent Application for all purposes.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND

1. Technical Field

This disclosure relates generally to wireless communications and more particularly to devices and components thereof that wirelessly communicate.

2. Description of Related Art

Communication systems are known to support wireless and wire lined communications between wireless and/or wire lined communication devices. Such communication systems range from national and/or international cellular telephone systems to the Internet to point-to-point in-home wireless networks to radio frequency identification (RFID) systems to radio frequency radar systems. Each type of communication system is constructed, and hence operates, in accordance with one or more communication standards. For instance, radio frequency (RF) wireless communication systems may operate in accordance with one or more standards including, but not limited to, RFID, IEEE 802.11x, Bluetooth, global system for mobile communications (GSM), code division multiple access (CDMA), WCDMA, local multi-point distribution systems (LMDS), multi-channel-multi-point distribution systems (MMDS), LTE, WiMAX, and/or variations thereof. As another example, infrared (IR) communication systems may operate in accordance with one or more standards including, but not limited to, IrDA (Infrared Data Association).

For an RF wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). The receiver is coupled to the antenna and includes a low noise amplifier, one or more intermediate frequency stages, a filtering stage, and a data recovery stage. The transmitter includes a data modulation stage, one or more intermediate frequency stages, and a power amplifier, which is coupled to the antenna.

Since a wireless communication begins and ends with the antenna, a properly designed antenna structure is an important component of wireless communication devices. As is known, the antenna structure is designed to have desired impedance (e.g., 50 Ohms) at an operating frequency, a desired bandwidth centered at the desired operating frequency, and a desired length (e.g., ¼ wavelength of the operating frequency for a monopole antenna). As is further known, the antenna structure may include a single monopole or dipole antenna, a diversity antenna structure, an antenna array having the same polarization, an antenna array having different polarization, and/or any number of other electromagnetic properties.

Some types of wireless communications require directionality of transmissions and directionality in receipt. One example of such a wireless communication system is a 60 GHz system, also referred to as a Millimeter Wave (MMW) system. RF signals in this spectrum, while capable of carrying significant data, attenuate rapidly and do not propagate well through structures. To support 60 GHz RF signals, a supporting device typically includes multiple directional antennas, each of which supports the transmission and receipt of signals in a respective direction. Isolation of these multiple directional antennas during transmission and receipt using common RF interface components is difficult and costly.

DETAILED DESCRIPTION

Figure 1:
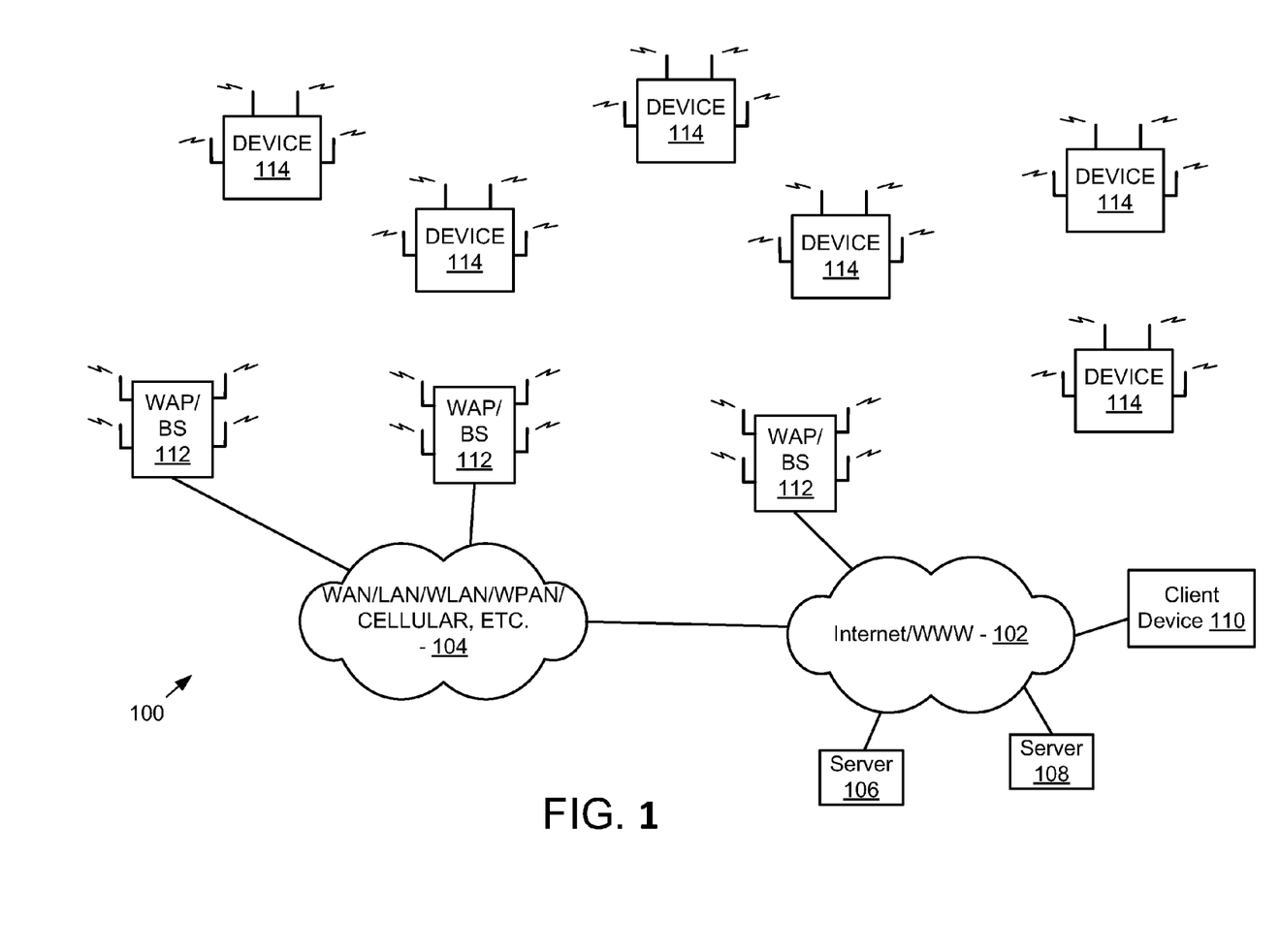
FIG. 1 is a system diagram illustrating a wireless communication system having wireless devices constructed according to the present disclosure.

FIG. 1 is a system diagram illustrating a wireless communication system 100 having wireless devices constructed according to the present disclosure. The wireless communication system includes a plurality of communication networks 104 that couple to the Internet/WWW 102 to service voice and data communications. Coupled to the Internet/

WWW 102 are servers 106 and 108 and at least one client device 110. The plurality of communication networks 104 includes one or more of a Wide Area Network (WAN), a Local Area Network (LAN), a Wireless Local Area Network (WLAN), a Wireless Personal Area Network (WPAN), a cellular network, and may include various other types of networks as well.

The plurality of communication networks 104 service a plurality of Wireless Access Points (WAPs) or base stations 112 that provide wireless service within respective service areas. WAPs provide wireless access service in respective service areas within servicing frequency bands, e.g., 2.4 GHz, 5 GHz, 60 GHz, etc., and support standardized (or proprietary) operating standards, e.g., IEEE 802.11x, Bluetooth, or other operating standards. Base stations, generally, provide wireless access service in respective service areas within respective frequency bands according to one or more cellular communication standards, e.g., GSM, LTE, xLTE, etc. In any case, these devices 112 provide voice and data service to a plurality of wireless devices 114, which will be described further herein. Some of these devices 112 may provide a combination of cellular, Wireless Wide Area Network (WWAN), Wireless Local Area Network (WLAN), and Wireless Personal Area Network (WPAN) service.

Wireless devices 114 service wireless communications with the wireless access points/base stations 112 and/or directly with one another. These wireless devices 114 may be found in various contexts, including the home, business, public spaces, and automobile. These wireless devices 114 may be cell phones, tablet computers, laptop computers, desktop computers, video games, automobiles, media players, digital cameras, smart phones, musical instruments, microphones, climate control systems, intrusion alarms, audio/video surveillance or security equipment, network attached storage, pet tracking collars, or other devices. As additional examples, the wireless devices 114 may further include audio head ends or DVD players, satellite music transceivers, noise cancellation systems, voice recognition systems, navigation systems, alarm systems, engine computer systems, set top boxes, remote controls, or other devices.

According to present disclosure, one or more of the wireless devices 114 includes an RF structure that supports directional wireless communications. Thus, the wireless devices 114 are shown to have antennas on differing sides, which support wireless communications in differing directions. When the wireless devices 114 support 60 GHz (Millimeter Wave—MMW) communications, the direction of transmission and receipt determines the effectiveness in servicing such communications. Thus, according to the present invention, the wireless devices 114 include an RF structure that supports directional transmission and receipt of RF communications in an improved fashion.

Figure 2:
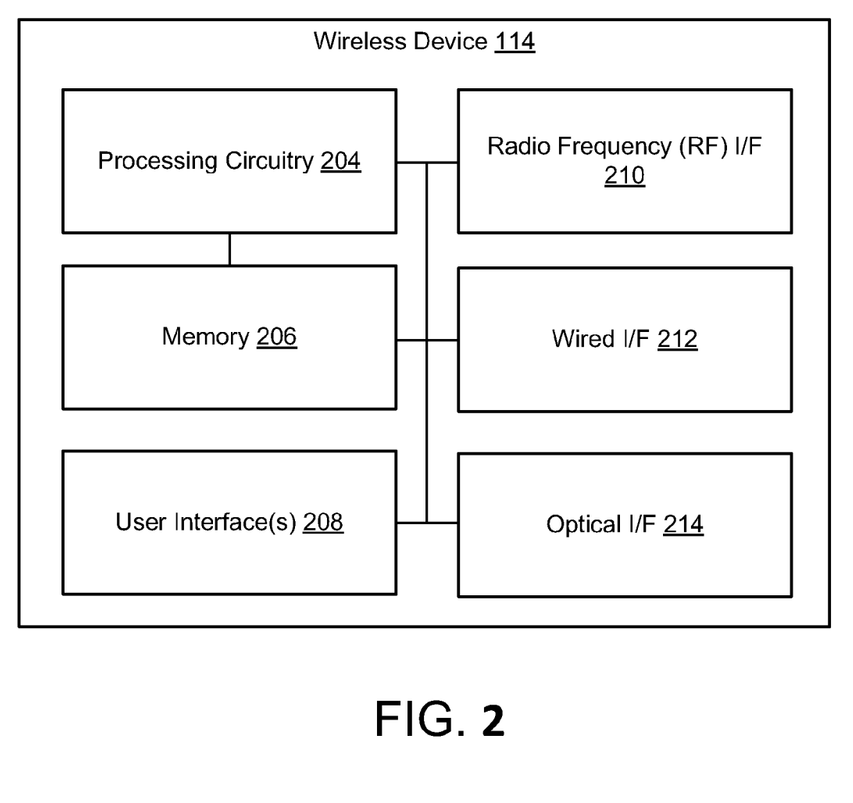
FIG. 2 is a block diagram illustrating a wireless device constructed according to the present disclosure.

FIG. 2 is a block diagram illustrating a wireless device 114 constructed according to the present disclosure. The communication device 202 includes processing circuitry 204, memory 206, one or more user interfaces 208, a Radio Frequency (RF) interface 210, and includes one or more of a wired interface 212 and an optical interface 214. The wireless device 114 may be one of the wireless devices 114 illustrated in FIG. 1.

The processing circuitry 204 may be one or more of a microprocessor, a digital signal processor, application specific processing circuitry, and/or other circuitry capable of executing logic operations based upon pre-programmed instructions or the execution of software instructions. The memory 206 may be dynamic RAM, static RAM, flash RAM, ROM, programmable ROM, magnetic storage, optical storage or other storage that is capable of storing instructions and data. The stored data may be audio data, video data, user data, software instructions, configuration data, or other data. The user interface 208 supports one or more of a video monitor, a keyboard, an audio interface, or other user interface device.

The RF interface 210 supports one or more of cellular communications, WLAN communications, WPAN communications, WWAN communications, 60 GHz (MMW) communications, NFC communications, and/or other wireless communications. These wireless communications are standardized in most embodiments and proprietary in other embodiments. The wired interface 212 supports wired communications, which may be LAN communications, WAN communications, cable network communications, direct data link communications, or other wired communications. The optical interface 214 supports optical communications, which are standardized in some embodiments and proprietary in other embodiments.

Multiple of the components 204, 206, 208, 210, 212, and 214 of the communication device may be constructed on a single integrated circuit die. It is fairly common to form all communication components, e.g., RF interface 210, wired interface 212, and optical interface 214 on a single integrated circuit. In some cases, even the antennas supporting the RF interface 210 may be formed on a single integrated circuit. In other cases, some or all of the components of the wireless device 114 may be formed on a Printed Circuit Board (PCB).

According to present disclosure, the RF interface 210 supports directional wireless communications. Thus, the wireless device 114 is shown to have antennas on differing sides, which support wireless communications in differing directions. When the wireless device 114 supports 60 GHz (Millimeter Wave—MMW) communications, the direction of transmission and receipt determines the effectiveness in servicing such communications. Thus, according to the present invention, the wireless device 114 includes an RF structure that supports directional transmission and receipt in an improved fashion as will be described further herein with reference to FIGS. 3A to 9.

Figure 3A:
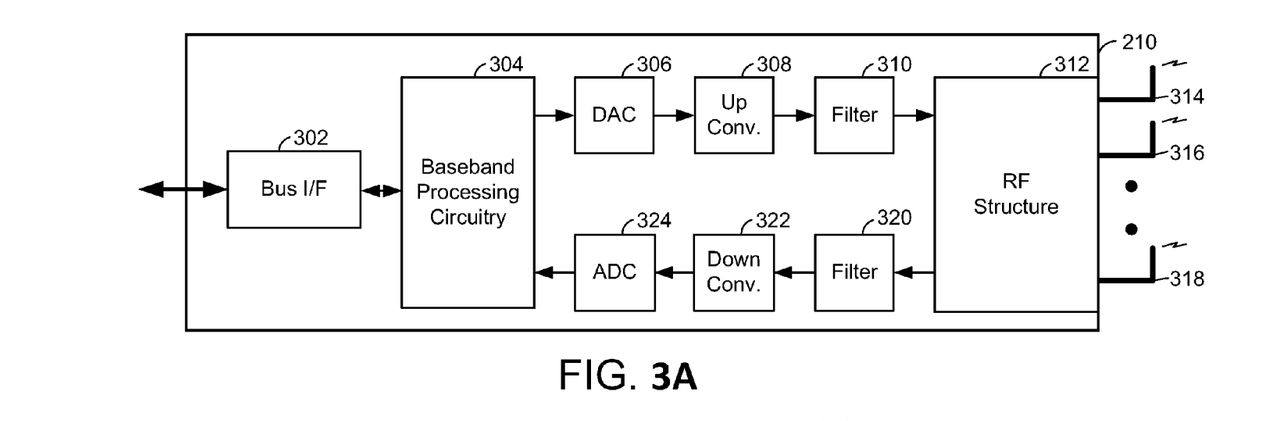
FIG. 3A is a block diagram illustrating a Radio Frequency (RF) interface of a wireless device constructed according to the present disclosure.

FIG. 3A is a block diagram illustrating a Radio Frequency (RF) interface 210 of a wireless device 114 constructed according to the present disclosure. The RF interface 210 includes a bus interface 302 that couples the RF interface 210 to a host bus to support transfer of voice and/or data communications. Baseband processing circuitry 304 couples to the bus interface 302 and supports baseband and/or Intermediate Frequency (IF) processing operations. Transmit data is provided by the baseband processing circuitry 304 to Digital to Analog Converter (DAC) 306. The output of the DAC is received by upconversion circuitry 308 that converts transmit data/information from baseband or IF to RF to produce an RF transmit signal. The RF transmit signal is filtered by filter block 310 and then provided to RF structure 312. The RF structure 312 couples to antennas 314, 316, and 318. While these antennas 314, 316 and 318 are shown to reside on a single side of the RF interface 210, they may be placed/formed such that they are placed to propagate in differing respective directions. Labeled are three antennas 314, 316 and 318. However, in many embodiments, the RF structure 312 will couple to more than three antennas and in some embodiments, less than three antennas.

In a receive path, the RF structure 312 produces a RF receive signal, which it receives via one or more of the antennas 314, 316 and 318 and provides the RF receive signal to filter 320, which filters the RF receive signal. The output of filter 320 is provided to down conversion circuitry 322, which down converts the RF receive signal to baseband or IF. Analog to Digital Converter (ADC) 324 receives the baseband or IF receive signal from the down conversion circuitry 322 and converts the receive signal to a digital format, which is provided to the baseband processing circuitry 304.

Figure 3B:
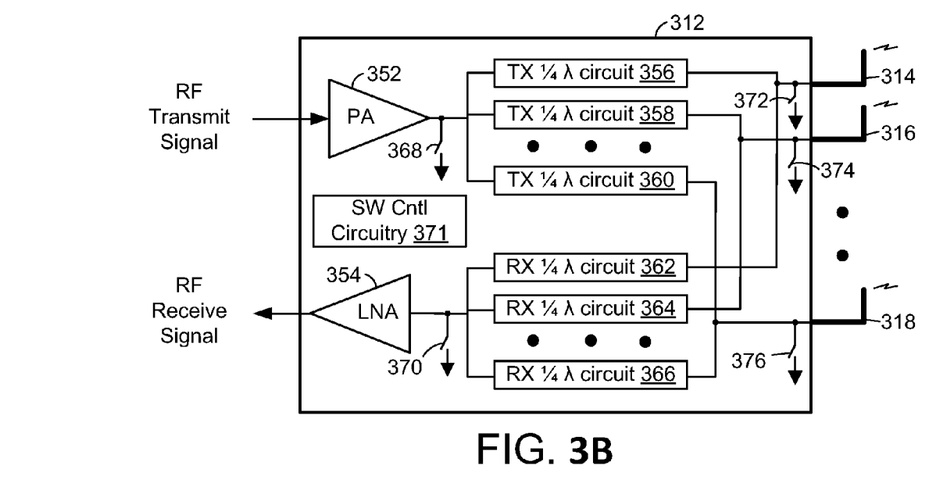
FIG. 3B is a block diagram illustrating an RF structure of an RF interface of a wireless device constructed according to the present disclosure.

FIG. 3B is a block diagram illustrating an RF structure 312 of an RF interface 210 of a wireless device 114 constructed according to the present disclosure. The RF structure 312 includes a Power Amplifier (PA) 352 that has a PA input and a PA output. The PA input receives an RF transmit signal, which it receives from the filter 310. The RF structure 312 also includes a Low Noise Amplifier (LNA) 354 having a LNA input and a LNA output that produces an RF receive signal to filter 320. The RF structure 312 further includes a PA ground switch 368 coupled between the PA output and ground and a LNA ground switch 370 coupled between the LNA input and ground.

The RF structure 312 further includes a plurality of directional antenna structures. Each of the directional antenna structure includes an antenna configured to transmit and receive in a respective direction, a transmit quarter wavelength circuit coupled between the PA output and the antenna, a receive quarter wavelength circuit coupled between the antenna and the LNA input, and an antenna switch coupled between the antenna and ground. With the embodiment of FIG. 3B, the RF structure 312 includes N directional antenna structures, where N is an integer and with three of the directional antenna structures labeled. With the embodiment of FIG. 3B, a first directional antenna structure includes a first antenna 314 configured to transmit and receive in a respective direction, a transmit quarter wavelength circuit 356 coupled between the PA 352 output and the antenna 314, a receive quarter wavelength circuit 362 coupled between the first antenna 314 and the LNA 354 input, and an antenna switch 372 coupled between the first antenna 314 and ground. A second directional antenna structure includes a second antenna 316 configured to transmit and receive in a respective direction, a transmit quarter wavelength circuit 358 coupled between the PA 352 output and the second antenna 316, a receive quarter wavelength circuit 364 coupled between the second antenna 316 and the LNA 354 input, and an antenna switch 374 coupled between the second antenna 316 and ground. An Nth directional antenna structure includes an Nth antenna 318 configured to transmit and receive in a respective direction, a transmit quarter wavelength circuit 360 coupled between the PA 352 output and the Nth antenna 318, a receive quarter wavelength circuit 362 coupled between the Nth antenna 318 and the LNA 354 input, and an antenna switch 376 coupled between the Nth antenna 318 and ground.

The RF structure 312 further includes switch control circuitry 371 configured to control the PA ground switch 368, the LNA ground switch 370, the first antenna switch 372, the second antenna switch 374, and the Nth antenna switch 376. The switch control circuitry 371 controls the position of these switches to control the transmission or receipt of RF communications from respective antennas. Generally, the switch control circuitry 371 is under control of the baseband processing circuitry 304 or other control circuitry of the RF interface 210.

When configuring the RF structure 312 to transmit from the first directional antenna structures, the switch control circuitry 371 opens the PA ground switch 368, closes the LNA ground switch 370, opens the first antenna switch 372, and closes all other antenna switches 374 and 376. Generally, by grounding the LNA input via LNA ground switch 370, the ground at the LNA 354 side of the receive quarter wavelength circuits 362, 364 and 366 translates to an substantially open impedance at the antenna side of the receive quarter wavelength circuits 362, 364 and 366. Likewise, by closing antenna switches 374 and 376, the impedance seen at the PA 352 side of the transmit quarter wavelength circuits 358 and 360 appears as a substantially open impedance. Thus, the only low impedance path from the PA 352 output is via the first transmit quarter wavelength circuit 356 to antenna 314. The switch control circuitry 371 performs similar switching operations when transmitting from the second and Nth directional antenna structures.

When configuring the RF structure 312 to receive from the first directional antenna structures, the switch control circuitry 371 closes the PA ground switch 368, opens the LNA ground switch 370, opens the first antenna switch 372, and closes all other antenna switches 374 and 376. Generally, by grounding the PA 352 output via PA ground switch 368, the ground at the PA 352 side of the transmit quarter wavelength circuits 356, 358 and 360 translates to an substantially open impedance at the antenna side of the transmit quarter wavelength circuits 356, 358 and 360. Likewise, by closing antenna switches 374 and 376, the impedance seen at the LNA 354 side of the receive quarter wavelength circuits 364 and 366 appears as a substantially open impedance. Thus, the only low impedance path from the antenna 314 to the LNA 354 is via the first receive quarter wavelength circuit 362. The switch control circuitry 371 performs similar switching operations when receiving from the second and Nth directional antenna structures.

In some embodiments of the RF structure 312, the transmit quarter wavelength circuits and the receive quarter wavelength circuits are microstrips formed on a substrate. In other embodiments of the RF structure, the microstrips are traces formed on a semi conductive substrate and/or traces formed on a Printed Circuit Board (PCB). The antennas 314, 316, and 318 may be external antennas, antennas formed on the PCB, or antennas formed on a semi conductive substrate. In various other embodiments, the transmit quarter wavelength circuits and the receive quarter wavelength circuit are formed from lumped circuit elements, e.g., capacitors, inductors, and resistors that may be formed on a semi conductive substrate and/or via discrete elements. In still other embodiments, the transmit quarter wavelength circuits and the receive quarter wavelength circuits are a combination of traces and lumped circuit elements. In other embodiments, the PA 352, the PA ground switch 368, the LNA 354, the LNA ground switch 370, and at least a portion of the directional antenna structures are formed on an Integrated Circuit (IC).

Figure 4A:
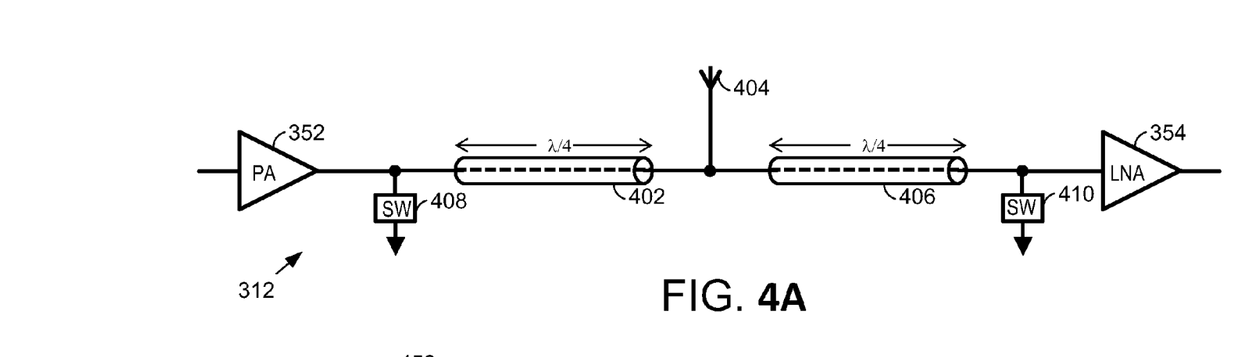
FIG. 4A is circuit diagram illustrating an embodiment of an RF structure of an RF interface according to the present disclosure that includes a single antenna.

FIG. 4A is circuit diagram illustrating an embodiment of an RF structure 312 of an RF interface according to the present disclosure that includes a single antenna. The RF structure 312 includes a PA 352 that has a PA input and a PA output. The PA input receives an RF transmit signal, which it receives from the filter 310. The RF structure 312 also includes a LNA 354 having a LNA input and a LNA output that produces an RF receive signal to filter 320. The RF structure 312 further includes a PA ground switch 408 coupled between the PA output and ground and a LNA ground switch 410 coupled between the LNA input and ground.

The RF structure 312 further includes an antenna structure. The antenna structure includes antenna 404 configured to transmit and receive RF signals, a transmit quarter wavelength circuit 402 coupled between the PA 352 output and the antenna 404, a receive quarter wavelength circuit 406 coupled between the antenna 404 and the LNA 354 input. During transmit operations the LNA ground switch 410 is closed so that the antenna 404 sees an substantially open impedance at the receive quarter wavelength circuit 406. During receive operations the PA ground switch 408 is closed so that the antenna 404 sees a substantially open impedance at the transmit quarter wavelength circuit 402.

Figure 4B:
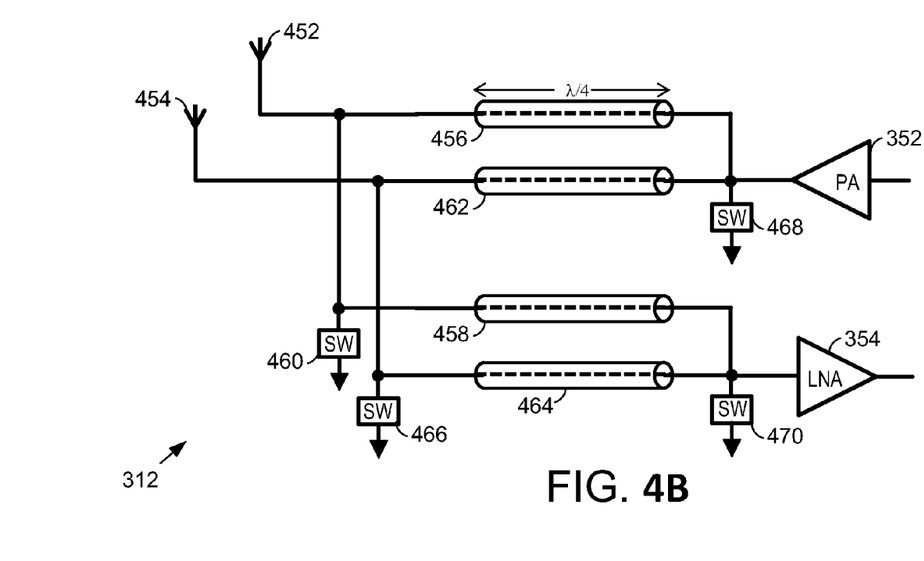
FIG. 4B is circuit diagram illustrating an embodiment of an RF structure of an RF interface according to the present disclosure that includes two antennas.

FIG. 4B is circuit diagram illustrating an embodiment of an RF structure 312 of an RF interface according to the present disclosure that includes two antennas. The RF structure 312 includes a PA 352 that has a PA input and a PA output. The PA input receives an RF transmit signal, which it receives from the filter 310. The RF structure 312 also includes a LNA 354 having a LNA input and a LNA output that produces an RF receive signal to filter 320. The RF structure 312 further includes a PA ground switch 468 coupled between the PA output and ground and a LNA ground switch 470 coupled between the LNA input and ground.

The RF structure 312 further includes two directional antenna structures. A first directional antenna structure includes first antenna 452 configured to transmit and receive in a respective direction, a first transmit quarter wavelength circuit 456 coupled between the PA 352 output and the first antenna 452, a first receive quarter wavelength circuit 458 coupled between the first antenna 452 and the LNA 354 input, and a first antenna switch 460. A second directional antenna structure includes second antenna 454 configured to transmit and receive in a respective direction, a second transmit quarter wavelength circuit 462 coupled between the PA 352 output and the second antenna 454, a second receive quarter wavelength circuit 464 coupled between the second antenna 454 and the LNA 354 input, and a second antenna switch 466.

During transmit operations from the first directional antenna structure, the LNA ground switch 470 is closed so that the first antenna 452 sees an substantially open impedance at the receive quarter wavelength circuit 458 and the second antenna switch 466 is closed so that the PA 352 sees an substantially open impedance at the second transmit quarter wavelength circuit 462. During receive operations the PA ground switch 468 is closed so that the first antenna 452 sees an substantially open impedance at the transmit quarter wavelength circuit 456 and the second antenna switch 466 is closed so that the LNA 354 sees an substantially open impedance at the second receive quarter wavelength circuit 464.

During transmit operations from the second directional antenna structure, the LNA ground switch 410 is closed so that the second antenna 454 sees an substantially open impedance at the receive quarter wavelength circuit 464 and the first antenna switch 460 is closed so that the PA 352 sees an substantially open impedance at the first transmit quarter wavelength circuit 456. During receive operations the PA ground switch 468 is closed so that the second antenna 454 sees an substantially open impedance at the transmit quarter wavelength circuit 462 and the first antenna switch 460 is closed so that the LNA 354 sees an substantially open impedance at the first receive quarter wavelength circuit 458.

Figure 5:
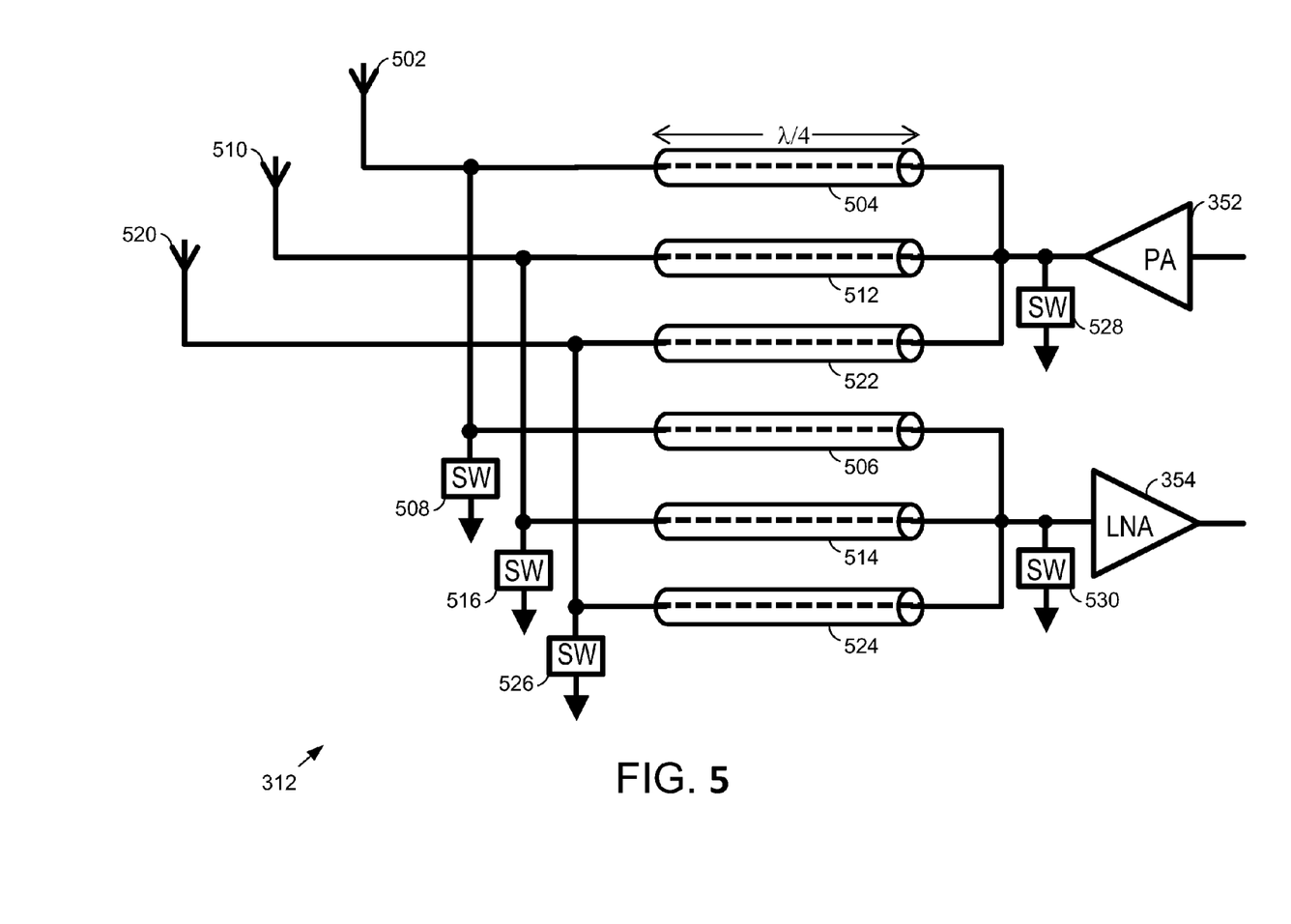
FIG. 5 is circuit diagram illustrating an embodiment of an RF structure of an RF interface according to the present disclosure that includes three antennas.

FIG. 5 is circuit diagram illustrating an embodiment of an RF structure 312 of an RF interface according to the present disclosure that includes three antennas. The RF structure 312 includes a PA 352 that has a PA input and a PA output. The PA input receives an RF transmit signal, which it receives from the filter 310. The RF structure 312 also includes a LNA 354 having a LNA input and a LNA output that produces an RF receive signal to filter 320. The RF structure 312 further includes a PA ground switch 528 coupled between the PA output and ground and a LNA ground switch 530 coupled between the LNA input and ground.

The RF structure 312 further includes three directional antenna structures. A first directional antenna structure includes first antenna 502 configured to transmit and receive in a respective direction, a first transmit quarter wavelength circuit 504 coupled between the PA 352 output and the first antenna 502, a first receive quarter wavelength circuit 506 coupled between the first antenna 502 and the LNA 354 input, and a first antenna switch 508. A second directional antenna structure includes second antenna 510 configured to transmit and receive in a respective direction, a second transmit quarter wavelength circuit 512 coupled between the PA 352 output and the second antenna 510, a second receive quarter wavelength circuit 514 coupled between the second antenna 510 and the LNA 354 input, and a second antenna switch 516. A third directional antenna structure includes third antenna 520 configured to transmit and receive in a respective direction, a third transmit quarter wavelength circuit 522 coupled between the PA 352 output and the third antenna 520, a third receive quarter wavelength circuit 524 coupled between the third antenna 520 and the LNA 354 input, and a third antenna switch 526.

Generally, transmitting from a particular antenna includes opening the PA ground switch 528, closing the LNA ground switch 530, opening a corresponding antenna switch for the transmitting antenna, and closing all other antenna switches. Likewise, generally, receiving from a particular antenna includes closing the PA ground switch 528, opening the LNA ground switch 530, opening a corresponding antenna switch for the receiving antenna, and closing all other antenna switches.

Figure 6:
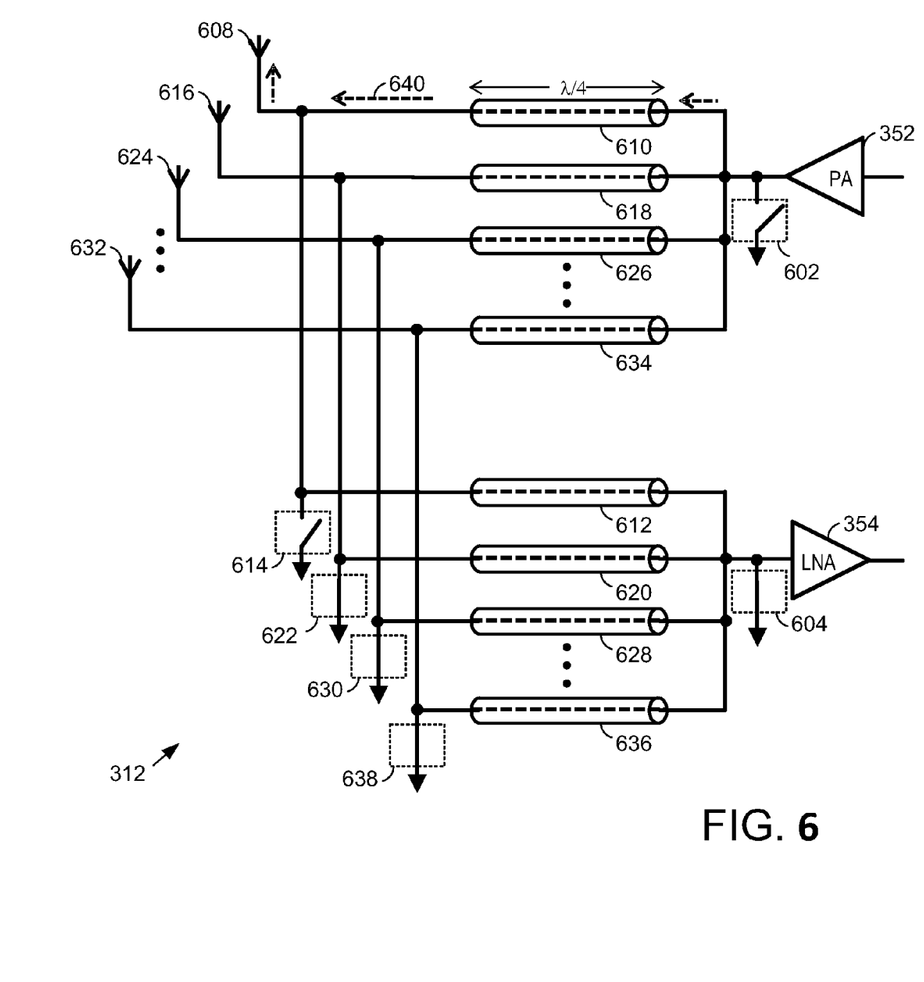
FIG. 6 is circuit diagram illustrating an embodiment of an RF structure of an RF interface according to the present disclosure that includes N antennas configured for transmit operations.

FIG. 6 is circuit diagram illustrating an embodiment of an RF structure 312 of an RF interface according to the present disclosure that includes N antennas configured for transmit operations. The RF structure 312 includes a PA 352 that has a PA input and a PA output. The PA input receives an RF transmit signal, which it receives from the filter 310. The RF structure 312 also includes a LNA 354 having a LNA input and a LNA output that produces an RF receive signal to filter 320. The RF structure 312 further includes a PA ground switch 602 coupled between the PA output and ground and a LNA ground switch 604 coupled between the LNA input and ground.

The RF structure 312 further includes N directional antenna structures, four of which are numbered. A first directional antenna structure includes first antenna 608 configured to transmit and receive in a respective direction, a first transmit quarter wavelength circuit 610 coupled between the PA 352 output and the first antenna 608, a first receive quarter wavelength circuit 612 coupled between the first antenna 608 and the LNA 354 input, and a first antenna switch 614. A second directional antenna structure includes second antenna 616 configured to transmit and receive in a respective direction, a second transmit quarter wavelength circuit 618 coupled between the PA 352 output and the second antenna 616, a second receive quarter wavelength circuit 620 coupled between the second antenna 616 and the LNA 354 input, and a second antenna switch 622. A third directional antenna structure includes third antenna 624 configured to transmit and receive in a respective direction, a third transmit quarter wavelength circuit 626 coupled between the PA 352 output and the third antenna 624, a third receive quarter wavelength circuit 628 coupled between the third antenna 624 and the LNA 354 input, and a third antenna switch 630. An Nth directional antenna structure includes Nth antenna 632 configured to transmit and receive in a respective direction, an Nth transmit quarter wavelength circuit 634 coupled between the PA 352 output and the Nth antenna 632, an Nth receive quarter wavelength circuit 636 coupled between the Nth antenna 632 and the LNA 354 input, and an Nth antenna switch 638.

The RF structure is configured to transmit via the first directional antenna structure. In such configuration, the switch control circuitry 371 opens the PA ground switch 602, closes the LNA ground switch 604, opens the first antenna switch 614, and closes all other antenna switches 622, 630, and 638. In such case, the RF transmit signal output from the PA 352 flows through the first transmit quarter wavelength circuit as RF transmit signal 640 to antenna 608. Because of the configuration of the switches, the PA 352 sees the characteristic impedance of the first transmit quarter wavelength circuit 610 with the input impedance of the other transmit quarter wavelength circuits 618, 626, and 634 appearing as substantially open impedances. Because of the configuration of the switches, the first antenna 608 sees the characteristic impedance of the first transmit quarter wavelength circuit 610 with the input impedance of the first receive quarter wavelength circuit 612 appearing as an substantially open impedance because the LNA ground switch 604 is closed.

Figure 7:
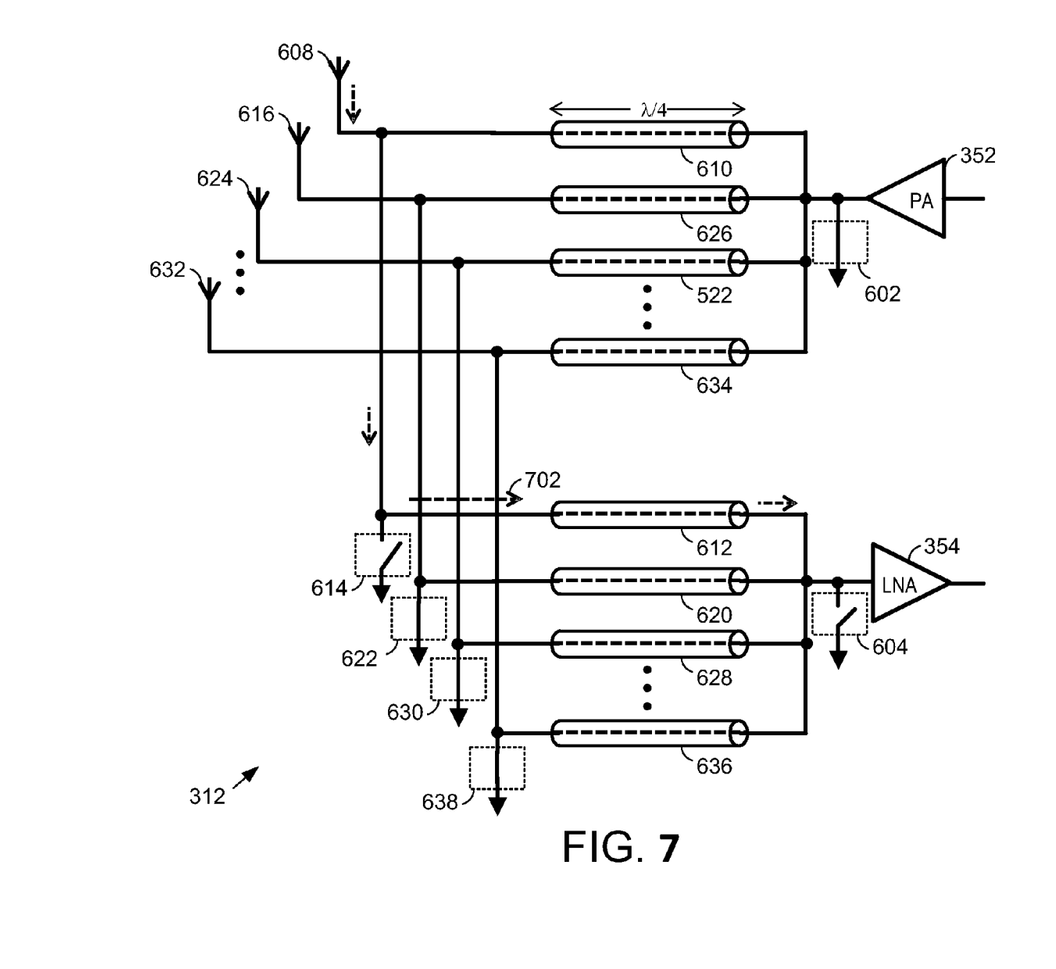
FIG. 7 is circuit diagram illustrating an embodiment of the RF structure of the RF interface of FIG. 6 configured for receive operations.

FIG. 7 is circuit diagram illustrating an embodiment of the RF structure 312 of the RF interface of FIG. 6 configured for receive operations. With the RF structure configured to receive via the first directional antenna structure, the switch control circuitry 371 closes the PA ground switch 602, opens the LNA ground switch 604, opens the first antenna switch 614, and closes all other antenna switches 622, 630, and 638. In such case, the RF transmit signal received via antenna 608 flows through the first receive quarter wavelength circuit 612 as RF receive signal 702 to LNA 354. Because of the configuration of the switches, the first antenna 608 sees the characteristic impedance of the first receive quarter wavelength circuit 612 with the input impedance of the first transmit quarter wavelength circuit 610 appearing as an substantially open impedance because the PA ground switch 602 is closed.

Figure 8:
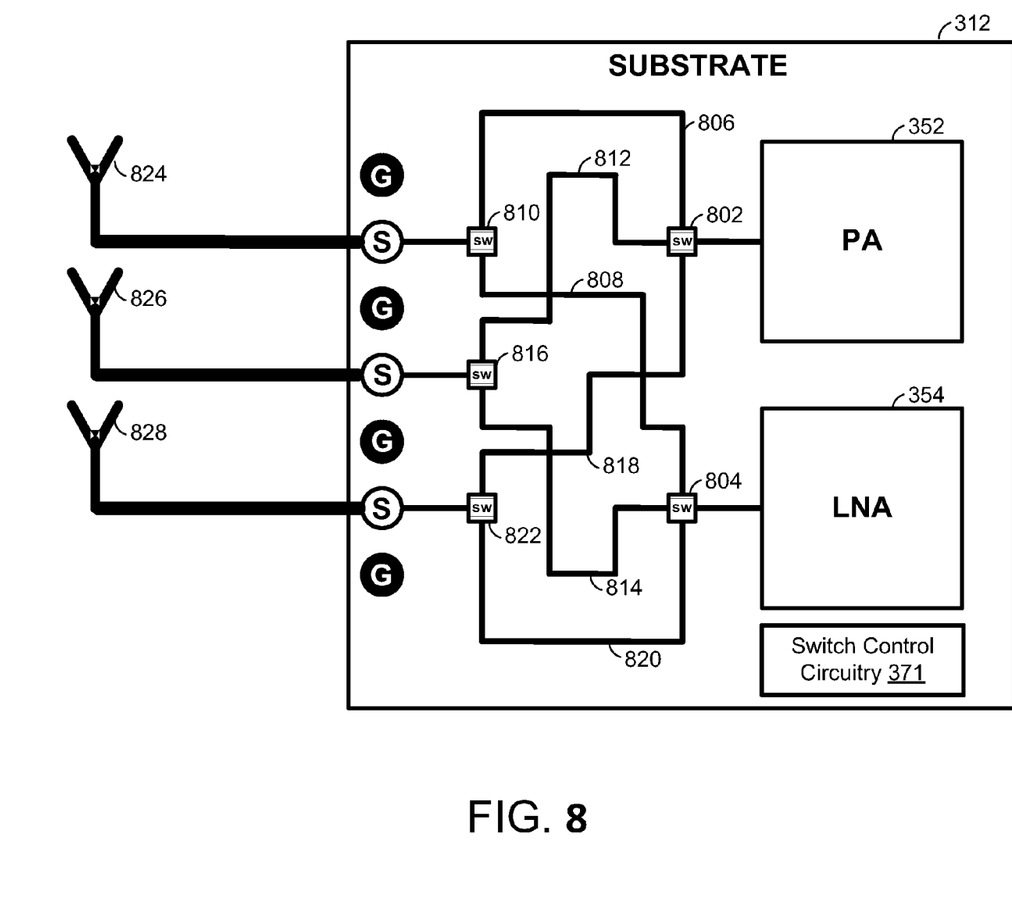
FIG. 8 is circuit diagram illustrating an embodiment of an RF structure of an RF interface according to the present disclosure that includes three antennas and which is formed on a substrate.

FIG. 8 is circuit diagram illustrating an embodiment of an RF structure 312 of an RF interface according to the present disclosure that includes three antennas and which is formed on a substrate. The RF structure 312 includes a PA 352 that has a PA input and a PA output. The PA input receives an RF transmit signal, which it receives from the filter 310. The RF structure 312 also includes a LNA 354 having a LNA input and a LNA output that produces an RF receive signal to filter 320. The RF structure 312 further includes a PA ground switch 802 coupled between the PA output and ground and a LNA ground switch 804 coupled between the LNA input and ground.

The RF structure 312 further includes three directional antenna structures. A first directional antenna structure includes first antenna 824 configured to transmit and receive in a respective direction, a first transmit quarter wavelength circuit 806 coupled between the PA 352 output and the antenna 824, a first receive quarter wavelength circuit 808 coupled between the antenna 824 and the LNA 354 input, and a first antenna switch 810. A second directional antenna structure includes second antenna 826 configured to transmit and receive in a respective direction, a second transmit quarter wavelength circuit 812 coupled between the PA 352 output and the antenna 826, a second receive quarter wavelength circuit 814 coupled between the antenna 826 and the LNA 354 input, and a second antenna switch 816. A third directional antenna structure includes third antenna 828 configured to transmit and receive in a respective direction, a third transmit quarter wavelength circuit 818 coupled between the PA 352 output and the antenna 828, a third receive quarter wavelength circuit 820 coupled between the antenna 828 and the LNA 354 input, and a third antenna switch 822. The RF structure 312 further includes switch control circuitry 371 that controls all of the PA ground switch 802, the LNA ground switch 804, and the antenna switches 810, 816, and 822.

The RF structure 312 may be formed on a single integrated circuit or multiple integrated circuits. Further, the RF structure 312 may be formed on a single PCB or multiple circuit boards. The quarter wavelength circuits 806, 808, 812, 818, 814, and 820 are traces formed in the integrate circuit or PCB having substantially a quarter wavelength length. These traces may also include some lumped circuit elements formed therewith for impedance matching purposes or otherwise.

Figure 9:
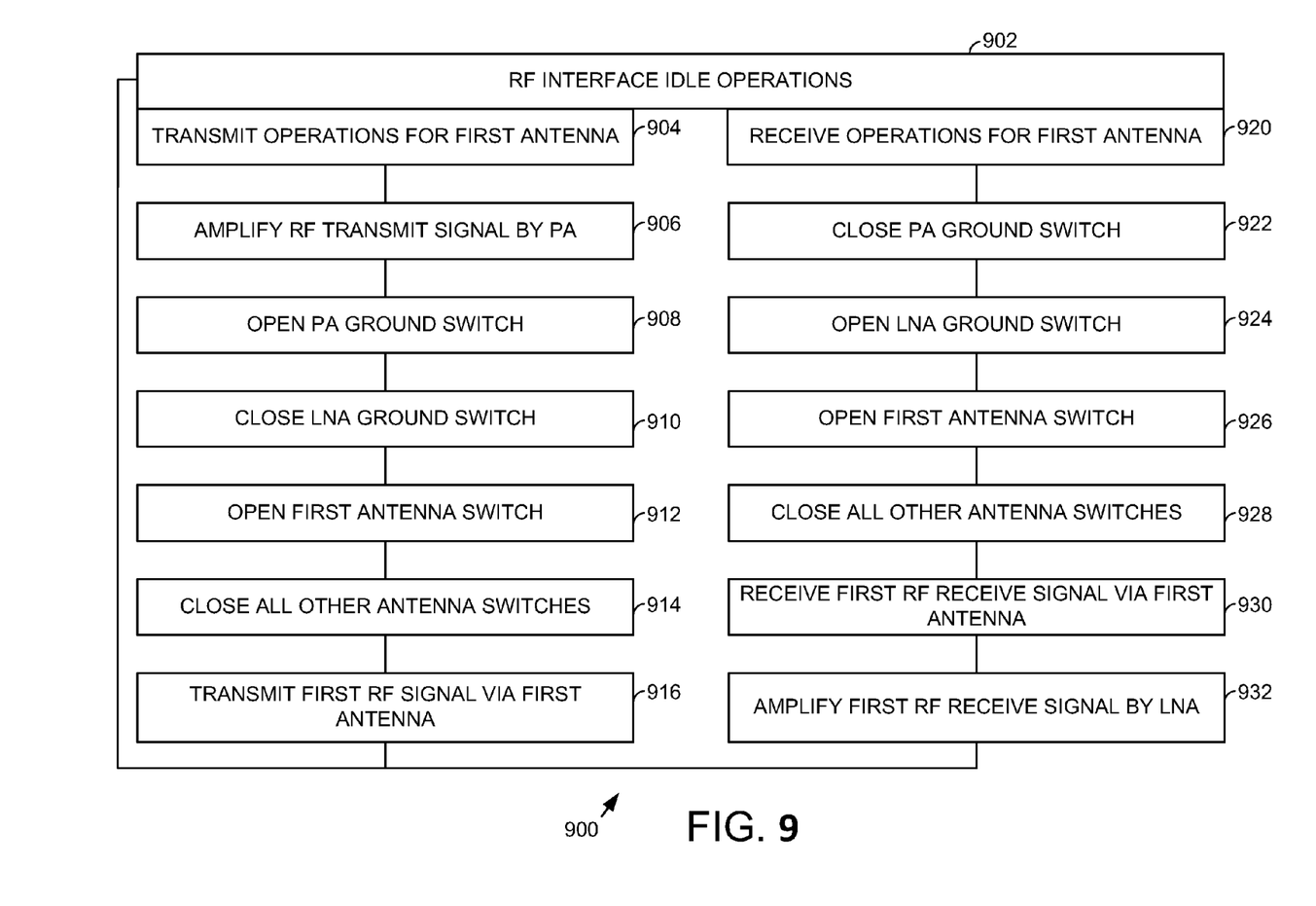
FIG. 9 is a flow chart illustrating an embodiment of operation of a wireless device according to the present disclosure.

FIG. 9 is a flow chart illustrating an embodiment of operation of a wireless device according to the present disclosure. The operations 900 described with reference to FIG. 9 may be performed with the various structures illustrated in FIGS. 1-8 and/or with similar structures. The operations 900 start with the wireless device having its RF interfaces in an idle state (Step 902). From Step 902, the wireless device may determine to enter during transmit operations for a first directional antenna structure of the at least two directional antenna structures (Step 904). The operations 900 of FIG. 9 are described with reference to a first directional antenna structure. These operations 900 may be repeated or alternately performed for other directional antenna structures of the RF interface of the wireless device. The operations proceed from Step 904 to amplifying a RF transmit signal by a Power Amplifier (PA) having a PA input and a PA output (Step 906). Operations then continue with opening a PA ground switch that couples between the PA output and ground (Step 908) and closing a Low Noise Amplifier (LNA) ground switch that couples between an LNA input and ground (Step 910). Then, operations include opening a first antenna switch corresponding to the first directional antenna structure (Step 912), the first antenna switch coupled between a first antenna and ground, coupled to an antenna side of a first transmit quarter wavelength circuit that couples between the PA output and the first antenna, and coupled to an antenna side of a first receive quarter wavelength circuit that couples between the first antenna and the LNA input. Operations continue with closing antenna switches corresponding to all other of the at least two directional antenna structures (Step 914).

From Step 902, the wireless device may determine to enter during receive operations for the first directional antenna structure of the at least two directional antenna structures (Step 920). The receive operations include closing the PA ground switch (Step 922), opening the LNA ground switch (Step 924), and opening the first antenna switch (Step 926). Operations continue with closing the antenna switches corresponding to the all other of the at least two directional antenna structures (Step 928), receiving a first RF receive signal via the first antenna (Step 930), and amplifying the first RF receive signal by the LNA (Step 932).

During transmit operations for a second directional antenna structure of the at least two directional antenna structures, the operations 900 include amplifying a second RF signal by the PA, opening the PA ground switch, closing the LNA ground switch, opening a second antenna switch corresponding to the second directional antenna structure, the second antenna switch coupled between a second antenna and ground, coupled to an antenna side of a second transmit quarter wavelength circuit that couples between the PA output and the second antenna, and coupled to an antenna side of a second receive quarter wavelength circuit that couples between the second antenna and the LNA input, closing antenna grounding switches corresponding to all other of the at least two directional antenna structures, and transmitting a second RF transmit signal via the second antenna. Further, during receive operations for the second directional antenna structure of the at least two directional antenna structures the operations include closing the PA ground switch, opening the LNA ground switch, opening the second antenna switch, closing the antenna switches corresponding to the all other of the at least two directional antenna structures, and receiving a second RF receive signal via the second antenna. Similar operations are performed for transmit and receive operations for the other N directional antenna structures.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to." As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with," includes direct and/or indirect coupling of separate items and/or one item being embedded within another item.

As may also be used herein, the term processing circuitry may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing circuitry may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing circuitry includes more than one processing device, the processing devices may be centrally located (e.g., directly coupled together via a wired and/or wireless bus structure) or may be distributed (e.g., cloud computing via indirect coupling via a local area network and/or a wide area network). Further note that if the processing circuitry implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing circuitry, and/or processing unit executes, hard coded and/or operational instructions corresponding to at least some of the steps and/or functions illustrated in one or more of the FIGs. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof. In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from FIG. to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a FIG. of any of the FIGs. presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A Radio Frequency (RF) structure comprising:
a Power Amplifier (PA) having a PA input and a PA output;
a PA ground switch coupled between the PA output and ground;
a Low Noise Amplifier (LNA) having a LNA input and a LNA output;
a LNA ground switch coupled between the LNA input and ground;
at least two directional antenna structures, each directional antenna structure comprising:
an antenna configured to transmit and receive in a respective direction;
a transmit quarter wavelength circuit coupled between the PA output and the antenna;
a receive quarter wavelength circuit coupled between the antenna and the LNA input; and
an antenna switch coupled between the antenna and ground; and
switch control circuitry configured, when transmitting from a first one of the directional antenna structures, to:
open the PA ground switch;
close the LNA ground switch;
open an antenna switch corresponding to the first one of the directional antenna structures; and
close antenna switches of all other of the directional antenna structures.

2. The RF structure of claim 1, the switch control circuitry further configured, when receiving via the first one of the directional antenna structures, to:
close the PA ground switch;
open the LNA ground switch;
open the antenna switch corresponding to the first one of the directional antenna structures; and
close the antenna switches of all other of the directional antenna structures.

3. The RF structure of claim 1, wherein at least one of the transmit quarter wavelength circuit and the receive quarter wavelength circuit comprise microstrips formed on a substrate.

4. The RF structure of claim 3, wherein the microstrips comprise traces formed on a semi conductive substrate.

5. The RF structure of claim 3, wherein the microstrips comprise traces formed on a printed circuit board.

6. The RF structure of claim 1, wherein at least one of the transmit quarter wavelength circuit and the receive quarter wavelength circuit comprise lumped circuit elements.

7. The RF structure of claim 1, wherein the PA, the PA ground switch, the LNA, the LNA ground switch, and at least a portion of the at least two directional antenna structures are formed on an Integrated Circuit (IC).

8. A Radio Frequency (RF) structure formed on a substrate comprising:
a Power Amplifier (PA) ground switch coupled between a PA output and ground;
a Low Noise Amplifier (LNA) ground switch coupled between an LNA input and ground;
at least two directional antenna structures, each directional antenna structure comprising:
an antenna configured to transmit and receive in a respective direction;
a transmit quarter wavelength circuit coupled between the PA output and the antenna;
a receive quarter wavelength circuit coupled between the antenna and the LNA input; and
an antenna switch coupled between the antenna and ground; and
switch control circuitry configured, when transmitting from a first one of the directional antenna structures, to:
open the PA ground switch;
close the LNA ground switch;
open an antenna switch corresponding to the first one of the directional antenna structures; and
close antenna switches of all other of the directional antenna structures.

9. The RF structure of claim 8, the switch control circuitry further configured, when receiving via the first one of the directional antenna structures, to:
close the PA ground switch;
open the LNA ground switch;
open the antenna switch corresponding to the first one of the directional antenna structures; and
close the antenna switches of all other of the directional antenna structures.

10. The RF structure of claim 8, wherein at least one of the transmit quarter wavelength circuit and the receive quarter wavelength circuit comprise microstrips formed on the substrate.

11. The RF structure of claim 10, wherein the microstrips comprise traces formed on a semi conductive substrate.

12. The RF structure of claim 10, wherein the microstrips comprise traces formed on a printed circuit board.

13. The RF structure of claim 8, wherein at least one of the transmit quarter wavelength circuit and the receive quarter wavelength circuit comprise lumped circuit elements.

14. The RF structure of claim 10, wherein the PA, the PA ground switch, the LNA, the LNA ground switch, and at least a portion of the at least two directional antenna structures are formed on an Integrated Circuit (IC).

15. A method for operating a communication device having a Radio Frequency (RF) structure that includes at least two directional antenna structures, the method comprising:
during transmit operations for a first directional antenna structure of the at least two directional antenna structures:
amplifying a RF transmit signal by a Power Amplifier (PA) having a PA input and a PA output;
opening a PA ground switch that couples between the PA output and ground;
closing a Low Noise Amplifier (LNA) ground switch that couples between an LNA input and ground;
opening a first antenna switch corresponding to the first directional antenna structure, the first antenna switch coupled between a first antenna and ground, coupled to an antenna side of a first transmit quarter wavelength circuit that couples between the PA output and the first antenna, and coupled to an antenna side of a first receive quarter wavelength circuit that couples between the first antenna and the LNA input;
closing antenna switches corresponding to all other of the at least two directional antenna structures; and
transmitting a first RF transmit signal via the first antenna.

16. The method of claim 15, wherein transmitting the RF transmit signal via the first antenna comprises coupling the RF transmit signal from the PA output to the first antenna via the first transmit quarter wavelength circuit.

17. The method of claim 15, further comprising:
during receive operations for the first directional antenna structure of the at least two directional antenna structures:
closing the PA ground switch;
opening the LNA ground switch;
opening the first antenna switch;

closing the antenna switches corresponding to the all other of the at least two directional antenna structures; and receiving a first RF receive signal via the first antenna.

18. The method of claim 17, wherein receiving the first RF receive signal via the first antenna comprises coupling the first RF receive signal from the first antenna to the LNA input via the first receive quarter wavelength circuit.

19. The method of claim 15, further comprising:
during transmit operations for a second directional antenna structure of the at least two directional antenna structures:
amplifying a second RF signal by the PA;
opening the PA ground switch;
closing the LNA ground switch;
opening a second antenna switch corresponding to the second directional antenna structure, the second antenna switch coupled between a second antenna and ground, coupled to an antenna side of a second transmit quarter wavelength circuit that couples between the PA output and the second antenna, and coupled to an antenna side of a second receive quarter wavelength circuit that couples between the second antenna and the LNA input;
closing antenna grounding switches corresponding to all other of the at least two directional antenna structures; and
transmitting a second RF transmit signal via the second antenna.

20. The method of claim 19, further comprising:
during receive operations for the second directional antenna structure of the at least two directional antenna structures:
closing the PA ground switch;
opening the LNA ground switch;
opening the second antenna switch;
closing the antenna switches corresponding to the all other of the at least two directional antenna structures; and
receiving a second RF receive signal via the second antenna.

\* \* \* \* \*